(12) United States Patent
Tanizumi et al.

(10) Patent No.: US 9,540,218 B2
(45) Date of Patent: Jan. 10, 2017

(54) WORK PLAN VERIFICATION DEVICE

(71) Applicant: TADANO LTD., Kagawa (JP)

(72) Inventors: Kazuya Tanizumi, Takamatsu (JP); Iwao Ishikawa, Takamatsu (JP); Kazuaki Tsuda, Takamatsu (JP); Shuji Fujiwara, Takamatsu (JP); Masayuki Munekiyo, Takamatsu (JP)

(73) Assignee: TADANO LTD., Kagawa (JP)

( * ) Notice: Subject to any disclaimer, the term of this patent is extended or adjusted under 35 U.S.C. 154(b) by 0 days.

(21) Appl. No.: 14/425,495

(22) PCT Filed: Aug. 8, 2013

(86) PCT No.: PCT/JP2013/071571
§ 371 (c)(1),
(2) Date: Mar. 3, 2015

(87) PCT Pub. No.: WO2014/038345
PCT Pub. Date: Mar. 13, 2014

(65) Prior Publication Data
US 2015/0217976 A1 Aug. 6, 2015

(30) Foreign Application Priority Data
Sep. 5, 2012 (JP) .................................. 2012-194733

(51) Int. Cl.
*G06F 17/50* (2006.01)
*B66C 15/00* (2006.01)
(Continued)

(52) U.S. Cl.
CPC .............. *B66C 15/00* (2013.01); *B66C 13/00* (2013.01); *B66C 13/46* (2013.01); *G06F 17/10* (2013.01); *G06F 17/5009* (2013.01)

(58) Field of Classification Search
CPC ...... G06F 17/10; G06F 17/5009; B66C 13/00; B66C 13/46; B66C 15/00
(Continued)

(56) References Cited

U.S. PATENT DOCUMENTS 5,823,370 A * 10/1998 Ueda ..................... B66C 23/905
212/276
6,170,681 B1 * 1/2001 Yoshimatsu .......... B66C 23/905
212/278
(Continued)

FOREIGN PATENT DOCUMENTS

CN 2273306 Y 1/1998
CN 1177334 A 3/1998
(Continued)

OTHER PUBLICATIONS

Niosh (Preventing Worker Injuries and Deaths from Mobile Crane Tip-Over, 2006, (26 pages)).*
(Continued)

*Primary Examiner* — David Silver
*Assistant Examiner* — Andre Pierre Louis
(74) *Attorney, Agent, or Firm* — Studebaker & Brackett PC

(57) ABSTRACT

Provided is a work plan verification device capable of improving work efficiency of movement work of a suspension load. The work plan verification device determines whether an operator indicates a movement position of the suspension load on an image (A) displayed on a monitor (30). When a determination is made that the movement position is indicated, a mark is displayed on the movement position (B). Subsequently, a determination is made that the suspension load is suspended on a boom. When the determination is made that the suspension load is suspended, a load factor (C1) which is moving determination information
(Continued)

allowing an operator to determine whether the suspension load can be moved to the movement position (B) is calculated, and the calculated load factor is displayed on the image (A).

5 Claims, 4 Drawing Sheets

(51) Int. Cl.
  *B66C 13/46* (2006.01)
  *B66C 13/00* (2006.01)
  *G06F 17/10* (2006.01)
(58) Field of Classification Search
  USPC .............................................................. 703/2
  See application file for complete search history.

(56) References Cited

U.S. PATENT DOCUMENTS

| | | | | |
|---|---|---|---|---|
| 2008/0309784 | A1* | 12/2008 | Asari | ........................ B60R 1/00 |
| | | | | 348/222.1 |
| 2015/0161872 | A1* | 6/2015 | Beaulieu | ................. B66C 13/40 |
| | | | | 340/686.6 |

FOREIGN PATENT DOCUMENTS

| | | |
|---|---|---|
| CN | 101077756 A | 11/2007 |
| CN | 201228202 Y | 4/2009 |
| EP | 2003018 A2 | 12/2008 |
| JP | S60-126491 U | 8/1985 |
| JP | H05-286692 A | 11/1993 |
| JP | H07-137982 A | 5/1995 |
| JP | H08-268681 A | 10/1996 |
| JP | H08-268685 A | 10/1996 |
| JP | 2000-247574 A | 9/2000 |
| JP | 2010-110355 A | 5/2010 |
| JP | 2011-207571 A | 10/2011 |

OTHER PUBLICATIONS

International Search Report; PCT/JP2013/071571; Nov. 5, 2013.
An Office Action issued by the Chinese Patent Office on Oct. 22, 2015, which corresponds to Chinese Patent Application No. 201350045925.1 and is related to U.S. Appl. No. 14/425,495.
The extended European search report issued by the European Patent Office on Apr. 1, 2016, which corresponds to European Patent Application No. 13835379.2-1705 and is related to U.S. Appl. No. 14/425,495.

* cited by examiner

WORK PLAN VERIFICATION DEVICE

TECHNICAL FIELD

The present invention relates to a work plan verification device used for a crane that includes a boom.

BACKGROUND ART

A conventional crane includes a boom to move a suspension load. The boom is telescopically formed and horizontally turnably and derrickably provided on a vehicle body.

A hook block is attached to a tip end of the boom through a wire. A hook is attached to a lower end of the hook block. The suspension load is hooked to the hook to be suspended.

A crane discloses a method of displaying a three-dimensional position of the suspension load (see Patent Literature 1). Another crane discloses a method of performing an operation of the crane by indication using a touch panel (see Patent Literature 2).

RELATED ART

Patent Literature

Patent Literature 1: Japanese Patent Application Publication No. H5-286692
Patent Literature 2: Japanese Patent Application Publication No. 2010-110355

SUMMARY OF THE INVENTION

Technical Problems

However, in the foregoing two methods, an operator cannot verify whether the suspension load can be moved to a position wanting to move. This results in inefficient work in movement of a suspension load. Therefore, a work plan verification device capable of improving work efficiency of movement work of a suspension load is required.

The present invention is made in view of the foregoing problems of related art and an object of the present invention is to provide a work plan verification device capable of improving work efficiency of movement work of a suspension load.

Solution to Problems

The inventors adopt a work plan verification device as described hereinafter as a result of intensive studies to solve the foregoing problems.

A work plan verification device according to the present invention includes a boom telescopically formed and horizontally turnably and derrickably provided on a vehicle body of a crane and that is used to move a suspension load suspended from a tip end of the boom through a rope. The work plan verification device includes an image creator that creates an image when viewing a lower portion from the tip end of the boom, a monitor that displays the image, a movement position inputter in that an operator indicates a movement position of the suspension load on the image displayed on the monitor, and a movement determination information calculator that calculates, based on a coordinate position of the movement position three-dimensionally corresponded to the movement position indicated on the image, a total rated load at the coordinate position and calculates movement determination information that allows the operator to determine whether the suspension load can be moved to the movement position based on the total rated load, and displays the calculated movement determination information on the image.

In addition, the work plan verification device according to the present invention further includes a suspension judger that determines whether the suspension load is suspended on the boom when indicating the movement position. When the suspension judger determines that the suspension load is not suspended on the boom, the movement determination information calculator may display a total rated load of the suspension load movable to the movement position as the movement determination information on the image.

Moreover, the work plan verification device according to the present invention further includes a virtual load inputter in which the operator inputs a virtual load of the suspension load, and the suspension judger that determines whether the suspension load is suspended on the boom when indicating the movement position. When the suspension judger determines that the suspension load is not suspended on the boom, the movement determination information calculator may calculate a load factor relating to movement to the movement position from a virtual load of the suspension load and a total rated load of the suspension load movable to the movement position, and display the calculated load factor as the movement determination information on the image.

In addition, in the work plan verification device according to the present invention including the suspension judger that determines whether the suspension load is suspended on the boom when indicating the movement position, when the suspension judger determines that the suspension load is not suspended on the boom, the movement determination information calculator may calculate the movement determination information based on an actual load of the suspension load when suspending the suspension load and a total rated load of the suspension load movable to the movement position and display the calculated movement determination information on the image.

In the work plan verification device according to the present invention including the suspension judger that determines whether the suspension load is suspended on the boom when indicating the movement position, when the suspension judger determines that the suspension load is suspended on the boom, the movement determination information calculator may calculate a load factor relating to movement to the movement position of the suspension load from an actual load of the suspension load and a total rated load of the suspension load movable to the movement position and display the calculated load factor as the movement determination information on the image.

Furthermore, in the work plan verification device according to the present invention, when the movement position is indicated, the movement determination information calculator may display on the image at least one of a height of the movement position and a working radius about a turning center of the boom to the movement position.

In addition, the work plan verification device according to according to the present invention, when the movement position is indicated, the movement determination information calculator may display on the image a performance line relating to a maximum suspension weight performance of the suspension load to pass through the movement position.

Furthermore, the work plan verification device according to the present invention, the image creator may create, as images displayed on the monitor, an image on which the movement determination information is displayed and, prior to the image, an image by which the operator indicates the movement position. In addition, in the work plan verification device according to the present invention, the movement determination information calculator determines whether the movement position is indicated on the image, and displays, when the movement position is indicated, a mark at the movement position on the image.

Effects of the Invention

In the work plan verification device according to the present invention, when an operator indicates a movement position of a suspension load on an image displayed on a monitor, movement determination information as to whether the suspension load can be moved to the movement position is adapted to display on the image. Thereby, the operator can previously verify whether the suspension load can be moved to a position wanting to move before moving. As a result, the work plan verification device according to the present invention can improve e work efficiency of movement work of the suspension load.

EMBODIMENTS OF THE INVENTION

Embodiments according to the present invention will be described hereinafter with reference to the accompanying drawings.
(First Embodiment)

Figure 1:
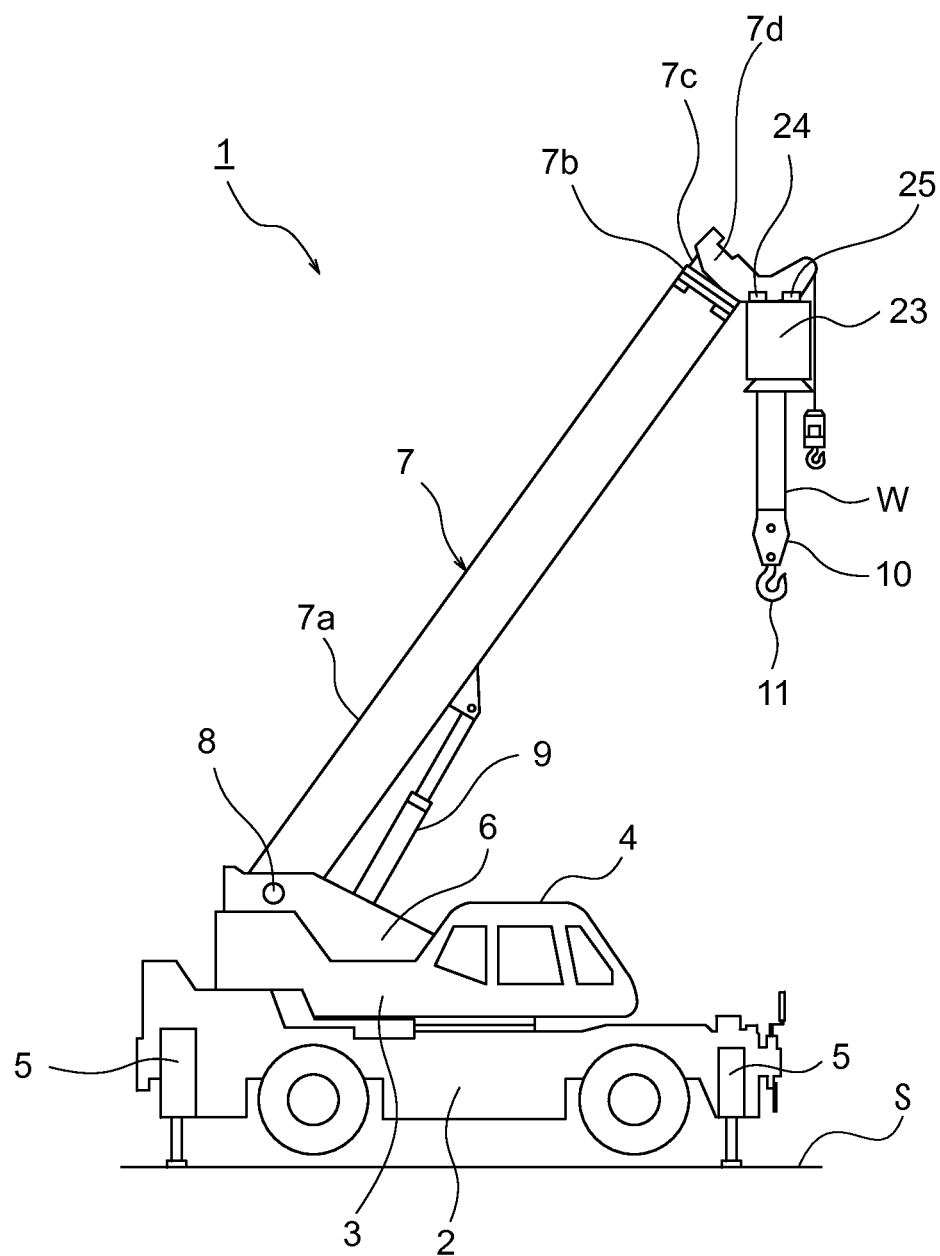
FIG. 1 is a side view showing a crane according to a first embodiment of the present invention.

FIG. 1 is a side view of a crane 1 according to a first embodiment of the present invention. First, an entire configuration of the crane 1 is described briefly. The crane 1 includes a carrier 2 which is a body portion (vehicle body) of a vehicle having a running function, a turning stage 3 horizontally and turnably attached to an upper portion of the carrier 2 and a cabin 4 provided on the turning stage 3.

Right and left pairs of outrigger 5, 5 (only the outriggers of one side of the vehicle are shown) are respectively provided at front and rear sides of the carrier 2. A bracket 6 is fixed to an upper side of the turning stage 3. A boom 7 is attached to the bracket 6.

The boom 7 has a base end portion mounted on the bracket 6 through a supporting shaft 8. The boom is configured to be derrickable about the supporting shaft 8. A boom-derricking cylinder 9 is provided between the bracket 6 and the boom 7. Extension and contraction of the boom-derricking cylinder 9 makes it possible to derrick the boom 7.

The boom 7 includes a base boom 7a, an intermediate boom 7b and a top boom 7c. The booms are telescopically combined by inserting the intermediate and top booms in the base boom 7a from an outer side to an inner side in this order. Each of the booms 7a to 7c is connected to extensible cylinders (not shown) arranged in an inner portion of each boom. The extension and contraction of each of the extensible cylinders cause a length of the booms to increase and decrease.

A sheave (not shown) is provided on a tip end portion 7d of the top boom 7c. A wire W extending from a winch (not shown) provided on the bracket 6 is hooked on the sheave. A hook block 10 is suspended on the wire W. A hook 11 is attached to a lower side of the hook block 10. A suspension load (not shown) is hooked on the hook 11 by a wire rope WR (rope: see FIG. 4).

A control panel (not shown) is provided in the cabin 4. The control panel includes an operation lever (not shown). The operation lever is operated by an operator and used to perform turning and derricking motions and extension and contraction of the booms, extension and storage of each outrigger 5, start and stop of an engine and so on.

Figure 2:
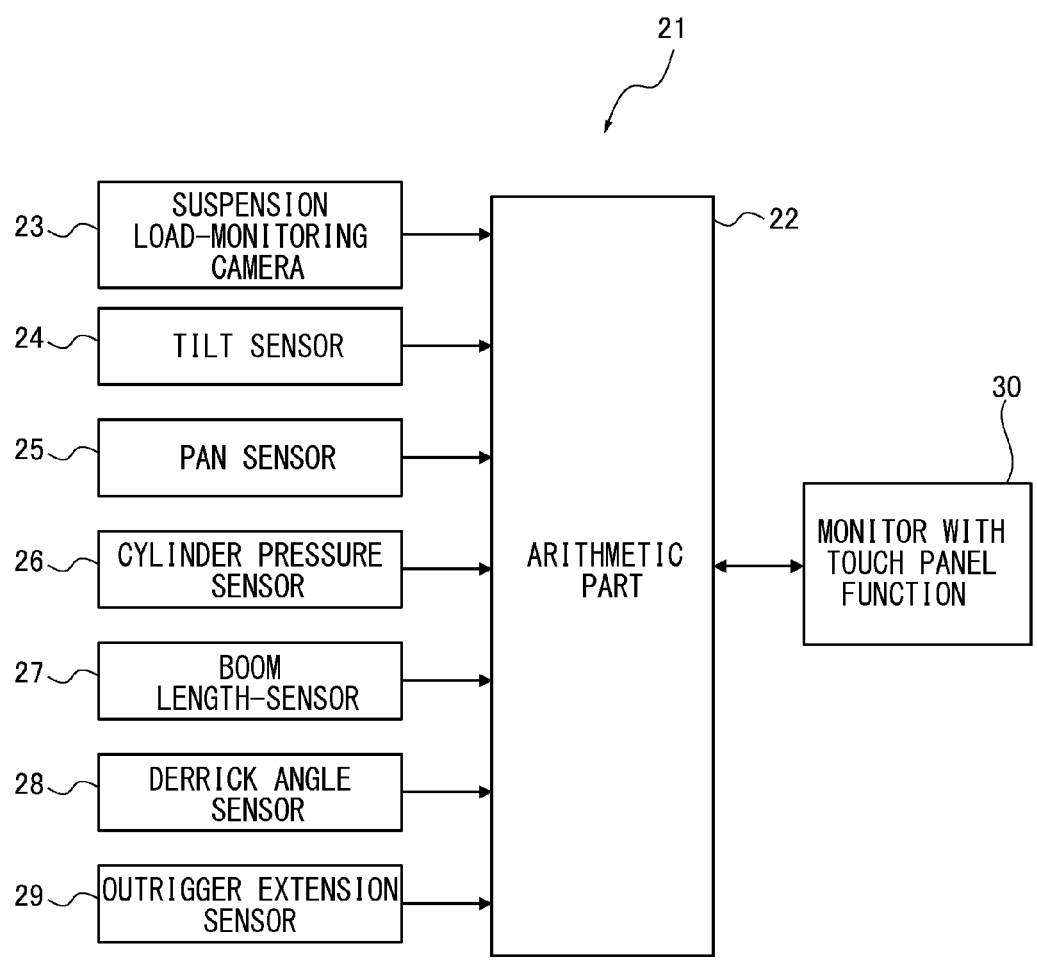
FIG. 2 is a block view showing a configuration of a work plan verification device used for the crane in the first embodiment.

FIG. 2 is a block view illustrating a configuration of a work plan verification device 21 according to the present invention, used for the crane 1. When moving the suspension load to a position (movement position) where the operator wants to move by the crane 1, the work plan verification device 21 allows an operator to determine whether the suspension load can be moved to the movement position.

The work plan verification device 21 includes an arithmetic part 22 which is a main configuration and executes various calculating processes. The arithmetic part 22 is provided, for example, in the cabin 4 (see FIG. 1).

A suspension load-monitoring camera 23, a tilt sensor 24, a pan sensor 25, a cylinder pressure sensor 26, a boom length-sensor 27, a derrick angle sensor 28 and an outrigger extension sensor 29 are connected to an inputting side of the arithmetic part 22. A monitor 30 with touch panel function is connected to the inputting side and an outputting side of the arithmetic part 22.

In the work plan verification device 21, an image creator according to the present invention is composed of the suspension load-monitoring camera 23. A monitor, a movement position-inputter and a virtual load-inputter according to the present invention are composed of the monitor 30 with touch panel function.

A suspension judger according to the present invention is composed of the cylinder pressure sensor 26, the derrick angle sensor 28, the boom length-sensor 27 and the arithmetic part 22.

A movement determination information calculator according to the present invention is composed of the suspension load-monitoring camera 23, the tilt sensor 24, the pan sensor 25, the cylinder pressure sensor 26, the boom length-sensor 27, the derrick angle sensor 28 and the outrigger extension sensor 29 and the arithmetic part 22.

The suspension load-monitoring camera 23 is attached to the tip end portion 7d of the top boom 7c, as shown in FIG. 1 and includes a lens positioned to be directed to right under the camera. The suspension load-monitoring camera 23 images a scene (the suspension load or a circumference thereof) when looking at a lower location from a tip end of the boom 7, and creates an image as imaged.

The suspension load-monitoring camera 23 is configured to be capable of being inclined in a tilt direction (vertical direction) and a pan direction (horizontal direction) at any angle to a vertical axis. The inclination of the suspension load-monitoring camera 23 is performed by the control panel (not shown) disposed in the cabin 4. In the following description, there is a case that the suspension load-monitoring camera 23 is referred to as a camera 23 simply.

The tilt sensor 24 and the pan sensor 25 are attached to an upper surface of the suspension load-monitoring camera 23, as shown in FIG. 1. The tilt sensor 24 and the pan sensor 25 detect an inclination angle of the suspension load-monitoring camera 23.

The cylinder pressure sensor 26 is attached to the boom-derricking cylinder 9 of the boom 7 to detect a pressure of the boom-derricking cylinder 9. The boom length-sensor 27 is attached to the boom 7 to detect a length and an extension amount of the boom 7. The derrick angle sensor 28 is attached to the boom 7 to detect a derrick angle of the boom 7.

The outrigger extension sensor 29 is attached to each of the outriggers 5 to detect an extension amount of the outrigger 5.

The monitor 30 with touch panel function is provided in the cabin 4 (see FIG. 1). The monitor 30 with touch panel function displays an image picked up by the camera 23 or a processed image created by the arithmetic part 22 to an operator.

Furthermore, the monitor 30 with touch panel function has a function (touch input function) that achieves various inputs implemented by the operator. A concrete content of these functions is to input a movement position of the suspension load on the imaged image, a virtual load of the suspension load and so on.

Here, the virtual load of the suspension load means a weight known prior to suspending without calculating actually a weight of the suspension load. In addition, an actually calculated weight of the suspension load is an actual load.

The monitor 30 with touch panel function is configured, when a movement position, a virtual load of the suspension load or the like is input, to output an input content thereof to the arithmetic part 22. In the following description, the monitor 30 with touch panel function is referred to as a monitor 30 simply.

Figure 3:
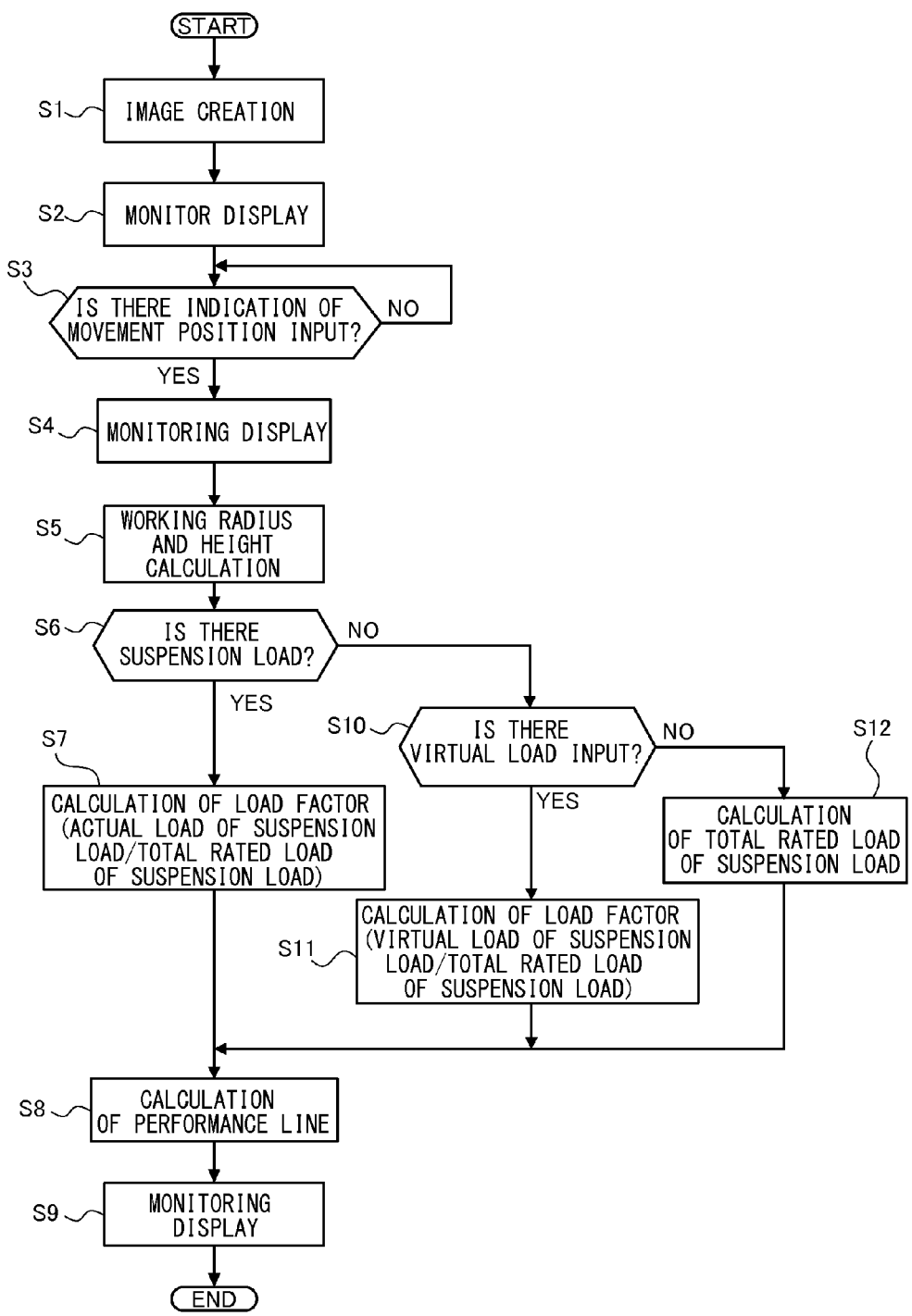
FIG. 3 is a flow chart showing a control process relating to movement determination of a suspension load by the work plan verification device shown in FIG. 2.

Next, a control process in a determination that moves the suspension load by the work plan verification device 21 is described with reference to a flowchart shown in FIG. 3.
(Step S1)
First, the camera 23 photographs a scene when viewing the lower part from the tip end of the boom 7 to create an imaged image. The imaged image is output to the arithmetic part 22.
(Step S2)
The arithmetic part 22 displays the image on the monitor 30. In addition, the arithmetic part 22 calculates a coordinate position of the imaged image defining a turning center of the boom 7 as an origin, based on a zoom magnification of the camera 23, an inclination angle of the camera 23 acquired from the tilt sensor 24 or the pan sensor 25 and a height position of the camera 23.

Here, the height position of the camera 23 is calculated based on a length of the boom 7 acquired from the boom length-sensor 27 and a derrick angle of the boom 7 acquired from the derrick angle sensor 28.

At this time, the operator looks at the image displayed on the monitor 30 and operates the boom 7 and the camera 23 such that the movement position thereof is in a frame of the image. In the state where the movement position is in the image, the coordinate position of the image including the movement position is calculated by the arithmetic part 22.
(Step S3)
Next, the arithmetic part 22 determines whether the movement position of the suspension load is indicated on the monitor 30. In other words, the arithmetic part 22 determines whether the operator indicates (touch input) the movement position of the suspension load on the image displayed on the monitor 30.
(Step S4)
The arithmetic part 22 displays, when it determines that the operator indicates the movement position on the image (the determination result in step S3 is YES), a mark of + character at the movement position B on the image A (see FIGS. 4 to 7).
(Step S5)
In addition, the arithmetic part 22 calculates a working radius from the turning center of the boom 7 to the movement position B and a height of the movement position B. The height of the movement position B means a height from the ground S (see FIG. 1: an installation surface of the crane 1). The height of the movement position B and the radius are calculated based on a coordinate position of the movement position B on the image A which is adapted to three-dimensionally correspond previously. In the image A, a height is zero (0) because the movement position B is on the ground S.
(Step S6)
Subsequently, the arithmetic part 22 determines whether the suspension load is suspended from the boom 7. The determination is executed based on a change amount in pressure of the boom-derricking cylinder 9 acquired from the cylinder pressure sensor 26, a change amount in a derrick angle of the boom 7 acquired from the derrick angle sensor 28, a winding up-amount of the winch and so on. A case where the suspension load is suspended from the boom 7 and a case where the suspension load is not suspended from the boom 7 are described hereinafter.
(A Case where the Suspension Load is Suspended from the Boom 7)
(Step S7)
When the arithmetic part 22 determines that the suspension load is suspended from the boom 7 (the determination result in step S6 is YES), a load factor related to the movement of the suspension load to the movement position B is calculated. The load factor means a ratio (actual load/total rated load) of the actual load to a total rated load of the suspension load movable to the movement position B. In addition, the load factor is movement determination information to allow the operator to determine whether the suspension load can be moved to the movement position B in a state where the suspension load is suspended.

The actual load of the suspension load is calculated based on a pressure of the boom-derricking cylinder 9 acquired from the cylinder pressure sensor 26, a length of the boom 7 acquired from the boom-length sensor 27 and a derrick angle of the boom 7 acquired from the derrick angle sensor 28.

The total rated load of the suspension load is calculated based on a length of the boom 7, an extension amount of each outrigger 5 acquired from each of the outrigger extension sensors 29 and a working radius about the turning center of the boom 7 to the movement position B. Here, the working radius is calculated based on the movement position B indicated on the monitor 30, as described in step S5.

(Step S8)

Moreover, the arithmetic part 22 calculates a performance line relating to a performance of the maximum suspension load of the suspension load of the crane 1. The performance line shows a line formed by the same load factor as the load factor in the movement position B as described above.

(Step S9)

Figure 4:
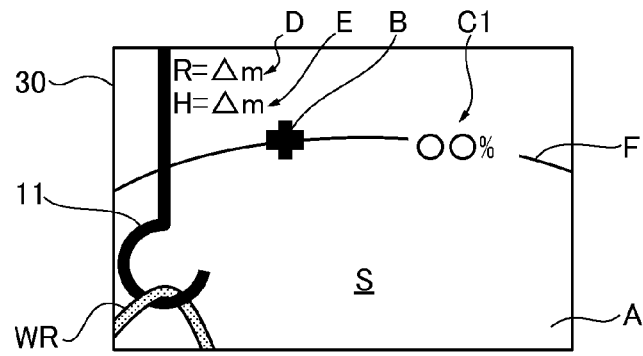
FIG. 4 is a diagram showing a display content of a monitor in a case where the suspension load is suspended on a boom in the embodiment.

Next, the arithmetic part 22 displays a load factor C1 which relates to the movement of the suspension load to the movement position B and is calculated in the steps S5 to S8 as shown in FIG. 4, a working radius D to the movement position B, a height E of the movement position B, a performance line F, on the image A. Here, the performance line F is displayed so as to pass through the movement position B because the performance line is formed by the same load factor as the load factor of the movement position B.

The operator determines whether the suspension load can be moved to the movement position B from the load factor C1 displayed on the imaged image A. If the load factor C1 is 100% or less, because the actual load of the suspension load exceeds the total rated load, a determination is made that the suspension load cannot be moved to the movement position B. In addition, if the load factor C1 exceeds 100%, the state is emphasized by changing a style of characters (color, thick and so on). Moreover, NG and so on may be displayed. Furthermore, a performance line of 100% may be added.

The operator adjusts the load factor C1 to be 100% or less, thereafter moves the suspension load to the movement position B by reducing, for example, a weight of the suspension load or changing the extension amount of each outrigger 5 or position of the crane 1 if the operator determines that the suspension load cannot be moved to the movement position B.

(A Case where the Suspension Load is not Suspended on the Boom 7 and the Virtual Load is Input)

(Step S10)

When the arithmetic part 22 determines that the suspension load is not suspended on the boom 7 (the determination result in step S6 is NO), the arithmetic part determines from the monitor 30 whether the input of the virtual load of the suspension load is executed. In other words, the arithmetic part 22 determines whether the operator inputs the virtual load of the suspension load.

(Step S11)

The arithmetic part 22 calculates a load factor according to the movement of the suspension load to the movement position B, when the arithmetic part determines that the input of the virtual load of the suspension load is executed (the determination result in step S10 is YES). The load factor is a ratio (virtual load/total rated load) of the virtual load to the total rated load of the suspension load movable to the movement position B. In addition, the load factor is movement determination information to allow the operator to determine whether the suspension load can be moved to the movement position B in a state where the suspension load is not suspended. A method of calculating the total rated load is as described in the step S7.

(Step S8)

In addition, the arithmetic part 22 calculates a performance line relating to the maximum suspension performance of the suspension load by the crane 1 in addition to the load factor. A method of calculating the performance line is as described in step S8 in the case where the suspension load is suspended.

(Step S9)

Figure 5:
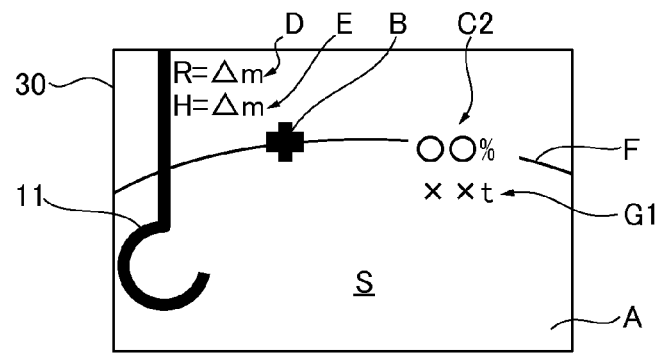
FIG. 5 is a diagram showing a display content of the monitor in a case where the suspension load is not suspended on the boom and a virtual load is input, in the embodiment.

Next, the arithmetic part 22 displays on the image A, a load factor C2 relating to the movement of the suspension load to the movement position B, the working radius D to the movement position B, the height E of the movement position B, the performance line F, and the virtual load G1 which are calculated in steps S5, S11, and S8, as shown in FIG. 5. Here, the performance line F is displayed to pass through the movement position B.

The operator determines from the load factor C2 displayed on the image A whether the suspension load can be moved to the movement position B. If the load factor C2 is 100% or less, a determination is made that the suspension load can be moved to the movement position B because the virtual load G1 is the same as or lesser than the total rated load. If the load factor C2 exceeds 100%, a determination is made that the suspension load cannot be moved to the movement position B because the virtual load G1 exceeds the total rated load. In addition, if the load factor C2 exceeds 100%, this state is emphasized by changing a style (color, thickness and so on) of characters. In addition to this, [NG] and so on may be displayed. Furthermore, a performance line of 100% may be added.

If the operator determines that the suspension cannot be moved to the movement position B, the operator adjusts the load factor C2 to be 100% or less, for example, by reducing a weight of the suspension load or changing an extension amount of each outrigger 5 or position of the crane 1, thereafter moves the suspension load to the movement position B.

(A Case where the Suspension Load is Suspended from the Boom 7 and the Virtual Load is not Input)

(Step S12)

If the arithmetic part 22 determines that the input of the virtual load of the suspension load is not executed (the determination result in step S10 is NO), the arithmetic part calculates a total rated load of the suspension load movable to the movement position B. A method of calculating the total rated load is as described in step S7. In addition, the total rated load is movement determination information to allow the operator to determine whether the suspension load can be moved to the movement position B in a state where the suspension load is not suspended.

(Step S8)

The arithmetic part 22 calculates a performance line relating to the performance line of the maximum suspension load by the crane 1 in addition to the total rated load. The calculated performance line shows a line formed by the same load as the total rated load in the movement position B described above.

(Step S9)

Figure 6:
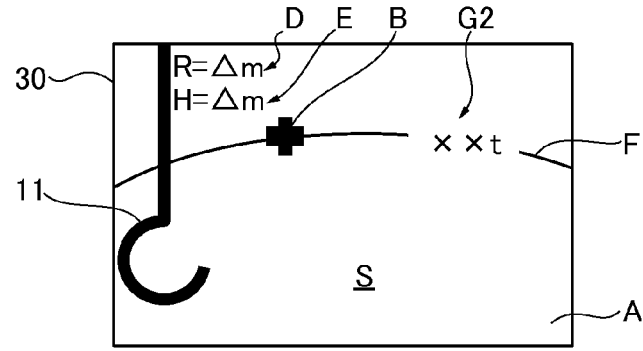
FIG. 6 is a diagram showing a display content of the monitor in a case where the suspension load is not suspended on the boom and the virtual load is not input.

Next, the arithmetic part 22 displays the working radius D to the movement position B, the height E of the movement position B, the performance line F, and the total rated load which are calculated in steps S5, S12 and S8, as shown in FIG. 6. Here, the performance line F is displayed to pass through the movement position B.

The operator judges whether the suspension load can be moved to the movement position B from a weight of the suspension load which is previously known by the operator and the total rated load G2 displayed on the image A. If the weight is the same as or lesser than the total rated load, a determination is made that the suspension load B can be moved. If the weight exceeds the total rated load, a determination is made that the suspension load B cannot be moved.

If the operator determines that the suspension load cannot be moved to the movement position B, the operator adjusts the weight of the of the suspension load to be the total rated load G2 or less by, for example, reducing the weight of the suspension load, or changing the extension amount of each outrigger 5 or the position of the crane 1, thereafter moves the suspension load to the movement position B.

As descried above, in the work plan verification device 21 according to the embodiment, when the operator indicates the movement position B of the suspension load on the image A displayed on the monitor 30, the movement determination information as to whether the suspension load can be moved to the movement position B is adapted to display on the image A. Thereby, the operator can previously verify before moving the suspension load as to whether the suspension load can be moved to the movement position B. Therefore, the work plan verification device 21 according to the embodiment can improve the work efficiency of the movement work of the suspension load. As a result, the operator can verify at the site whether the movement work of the suspension load can be executed as a previously prepared work plan.

In addition, in the work plan verification device 21 according to the embodiment, when indicating the movement position B, if the suspension load is not suspended on the boom 7 and the virtual load of the suspension load is not input, the total rated load G2 of the suspension load is used as the movement determination information. Thereby, if the operator previously knows the weight of the suspension load or the weight is measured in the state where the suspension load is suspended, the operator can verify whether the suspension load can be moved to the movement position B. Therefore, it is possible to improve the work efficiency of the movement work of the suspension load.

In addition, in the work plan verification device 21 according to the embodiment, when indicating the movement position B, if the suspension load is not suspended on the boom 7 and the virtual load of the suspension load is input, the load factor C2 (the virtual load of the suspension load/total rated load of the suspension load) is used as the movement determination information. Thereby, the operator can verify whether the suspension load in which the virtual load is input before the suspended load is suspended can be moved to the movement position B. Therefore, it is possible to improve the work efficiency of the movement work of the suspension load.

In addition, in the work plan verification device 21 according to the embodiment, when indicating the movement position B, if the suspension load is suspended on the boom 7, the load factor C1 (the actual load of the suspension load/total rated load of the suspension load) is used as the movement determination information. Thereby, the operator can verify whether the suspension load can be moved to a position wanting to move in the state where the suspended load is suspended. Therefore, it is possible to improve the work efficiency of the movement work of the suspension load.

Furthermore, in the work plan verification device 21 according to the embodiment, the working radius D and the height E of the movement position are displayed on the image A. Thereby, the operator can easily grasps height information of the movement position of the suspension load and a range capable of moving the suspension load. Therefore, it is possible to further improve the work efficiency of the movement work of the suspension load.

Furthermore, in the work plan verification device 21 according to the embodiment, the performance line F is displayed on the image A. Thereby, the operator can easily grasps the range of the maximum suspension load performance of the suspension load by the crane, passing through the movement position B. Therefore, it is possible to further improve the work efficiency of the movement work of the suspension load.

Although the embodiment according to the present invention has been described, the present invention is not limited to the embodiment. In addition, modifications and changes can be made to the embodiment as long as such modifications and changes are within the scope of the present invention as defined by the Claims.

For example, in the work plan verification device 21 according to the embodiment, at least one of the working radius D and the height E of the movement position may be displayed on the image A, although both thereof have been displayed.

Figure 7:
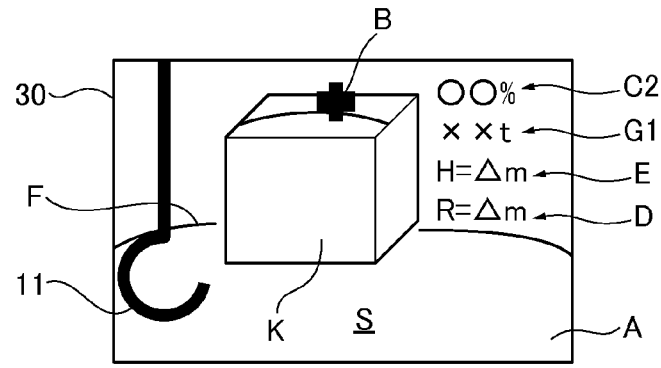
FIG. 7 is a diagram showing a display content of the monitor in a case where the movement position of the suspension load is on a roof of a building.

Moreover, although the work plan verification device 21 according to the embodiment has been applied to the example in which the movement position B is on the ground S, for example, it may be applied to an example in which the movement position B is, for example, on the roof of a building K, as shown in FIG. 7. In this case, the height E of the movement position B is displayed by a height from the ground S. In addition, the performance line F is displayed to pass through the roof of the building K. Note that the height E of the movement position B may be a height from the camera 23 to the movement position B.

In addition, the work plan verification device 21 may be configured to calculate the load factor C1 (the actual load of the suspension load/the total rated load of the suspension load) as the movement determination information based on the actual load and the total rated load when suspending the suspension load in the case where the suspension load is not suspended on the boom 7 when indicating the movement position B and display the calculated load factor on the image A. In this case, the operator can verify whether the suspension load can be moved to the position wanting to move when suspending the suspension load. Therefore, it is possible to improve the work efficiency of the movement work of the suspension load.

In addition, if the work plan verification device 21 determines that the suspension load cannot be moved, a notification representing "the suspension load cannot be moved to the indicated position" as "the movement determination information" may be made by a sound or character information. Here, a case where the work plan verification device 21 can determine that the suspension load cannot be moved includes the case where the load factor exceeds 100%, the case where the indicated position is out of an area in which the hook 11 can be moved and so on, as described above.

In addition, the camera 23 may be configured to create an image that indicates the movement position B by the operator prior to the imaged image A presently displayed on the monitor 30. In other words, the camera 23 creates an imaged image on which the movement determination information is displayed and an imaged image that indicates the movement position by the operator prior to the former imaged image, as imaged images displayed on the monitor 30.

Thereby, because the operator can indicate the movement position B in a work area displayed before the present display is not made, the work efficiency of the movement work of the suspension load can be further improved.

Moreover, an image in which a wide range is imaged before zooming up the image as the image in which the operator indicates the movement position B may be used. In this case, it is possible to display the movement determination information on the image, even if the imaged image at the time of suspending the suspension load is zoomed up and the movement position B is out of the display range.

Besides, an overhead view image formed by graphic may be used. In this case, because it is not necessary to photograph a wide range by panning, tilting and zooming up the camera 23, a time requiring to the indication of the movement position B can be reduced, and therefore, it is possible to further improve the work efficiency of the movement work of the suspension load.

Moreover, in the work plan verification device 21 according to the embodiment, although the monitor 30 with touch panel function as the movement position inputter according to the present invention is used, other device such as an mouse, key board or the like may be used. If the key board is used, the movement position B may be indicated by inputting numerals relating to a position of the crane 1 such as the working radius or the turning angle and so on, for example. In addition, a movement course may be prepared by indicating a plurality of positions other than the movement position B to determine whether the suspension load can be moved from the movement course.

Furthermore, in the work plan verification device 21 according to the embodiment, if the suspension load is not suspended on the boom 7 and the virtual load is input, the load factor C2 and the virtual load G1 are displayed, as shown in FIG. 5. However, if the load factor C2 exceeds 100%, instead of the virtual load G1, the total rated load G2 may be displayed. In this case, the operator can easily determine to what extent the weight of the suspension load should be reduced. As a result, it is possible to further improve the work efficiency of the movement work of the suspension load.

In addition, in the work plan verification device 21 according to the embodiment, the load factor is set as a ratio of the load, but it may be set as a ratio of moment. In other words, a moment load factor=(the virtual load, a moment about a rotation fulcrum of the boom in consideration of a dead load and so on of the boom)/(the total rated load, the moment about the rotation fulcrum of the boom in consideration of the dead load and so on of the boom). The actual load is the same as that.

CROSS REFERENCE TO RELATED APPLICATION

This application is based upon and claims the benefit of priority to Japanese Patent Application No. 2012-194733 filed on Sep. 5, 2012, the entire disclosures of which are incorporated herein by reference.

EXPLANATION OF REFERENCE NUMERALS 1 crane
2 carrier
7 boom
21 work plan verification device
22 arithmetic part
23 suspension load-monitoring camera
24 tilt sensor
25 pan sensor
26 cylinder pressure sensor
27 boom length-sensor
28 derrick angle sensor
29 outrigger extension sensor
30 monitor with touch panel function
A imaged image
B movement position of suspension load
C1 load factor
C2 load factor
D working radius
E height of movement position
F performance line
G1 virtual load of suspension load
G2 total rated load of suspension load
WR wire rope

The invention claimed is:

1. A work plan verification device that includes a boom telescopically formed and horizontally turnably and derrickably provided on a vehicle body of a crane and that is used to move a suspension load suspended from a tip end of the boom through a rope, the work plan verification device, comprising:
a boom-derricking cylinder provided between the vehicle body of the crane and the boom and that derricks the boom;
a cylinder pressure sensor attached to the boom-derricking cylinder and that detects a pressure of the boom-derricking cylinder;
a boom length-sensor attached to the boom and that detects a length of the boom;
a derrick angle sensor attached to the boom and that detects a derrick angle of the boom;
an image creator that creates an image when viewing a lower portion from the tip end of the boom;
a monitor that displays the image;
a movement position inputter in that an operator indicates a movement position of the suspension load on the image displayed on the monitor; and
an arithmetic part that determines whether the movement position is indicated on the image and that acquires a three-dimensional coordinate position of the movement position, the three-dimensional coordinate position corresponding to the movement position indicated on the image, when it is determined that the movement position is indicated on the image,
wherein the arithmetic part calculates a total rated load based on the acquired three-dimensional coordinate of the movement position and determines whether the suspension load is suspended from the boom based on a change amount in the pressure of the boom-derricking cylinder acquired from the cylinder pressure sensor or a change amount in the derrick angle of the boom acquired from the derrick angle sensor,
when the suspension load is suspended from the boom, the arithmetic part calculates an actual load of the suspension load based on the pressure of the boom-derricking cylinder acquired from the cylinder pressure sensor, the length of the boom acquired from the boom-length sensor and the derrick angle of the boom acquired from the derrick angle sensor and calculates a load factor which is a ratio of the actual load to the total rated load, and displays the load factor on the image,
when the suspension load is not suspended from the boom, the arithmetic part determines whether a virtual load is input into the movement position inputter and calculates a load factor which is a ratio of the virtual load to the total rated load when the virtual load is input, and displays the load factor on the image.

2. The work plan verification device according to claim 1, wherein, when the movement position is indicated, the movement determination information calculator displays on the image at least one of a height of the three-dimensional coordinate position of the movement position and a working radius about a turning center of the boom to the three-dimensional coordinate position of the movement position.

3. The work plan verification device according to claim 1, wherein, when the movement position is indicated, the movement determination information calculator displays on the image a performance line relating to a maximum suspension weight performance of the suspension load to pass through the movement position.

4. The work plan verification device according to claim 1, wherein the image creator creates, as images displayed on the monitor, an image on which the movement determination information is displayed and, prior to the image, an image by which the operator indicates the movement position.

5. The work plan verification device according to claim 1, wherein the movement determination information calculator determines whether the movement position is indicated on the image, and displays, when the movement position is indicated, a mark at the movement position on the image.

\* \* \* \* \*